(12) United States Patent
Doi et al.

(10) Patent No.: US 10,797,219 B2
(45) Date of Patent: Oct. 6, 2020

(54) PIEZOELECTRIC PTZT FILM, AND PROCESS FOR PRODUCING LIQUID COMPOSITION FOR FORMING SAID PIEZOELECTRIC FILM

(71) Applicant: MITSUBISHI MATERIALS CORPORATION, Tokyo (JP)

(72) Inventors: Toshihiro Doi, Naka-gun (JP); Nobuyuki Soyama, Matsudo (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 610 days.

(21) Appl. No.: 15/549,797

(22) PCT Filed: Feb. 15, 2016

(86) PCT No.: PCT/JP2016/054292
§ 371 (c)(1),
(2) Date: Aug. 9, 2017

(87) PCT Pub. No.: WO2016/133045
PCT Pub. Date: Aug. 25, 2016

(65) Prior Publication Data
US 2018/0033950 A1 Feb. 1, 2018

(30) Foreign Application Priority Data

Feb. 16, 2015 (JP) ................. 2015-027132

(51) Int. Cl.
| | | |
|---|---|---|
| *H01L 41/187* | (2006.01) | |
| *H01L 41/18* | (2006.01) | |
| *H01L 41/43* | (2013.01) | |
| *H01L 41/318* | (2013.01) | |
| *C01G 35/00* | (2006.01) | |
| *C04B 35/499* | (2006.01) | |
| *H01L 41/319* | (2013.01) | |

(52) U.S. Cl.
CPC ............ *H01L 41/18* (2013.01); *C01G 35/006* (2013.01); *C04B 35/499* (2013.01); *H01L 41/1876* (2013.01); *H01L 41/318* (2013.01); *H01L 41/43* (2013.01); *H01L 41/319* (2013.01)

(58) Field of Classification Search
CPC ....... H01L 41/18; H01L 41/318; H01L 41/43; C01G 35/006; C04B 35/499
USPC ................................. 310/311–371
See application file for complete search history.

(56) References Cited

U.S. PATENT DOCUMENTS

| | | | | |
|---|---|---|---|---|
| 2002/0098333 A1* | 7/2002 | Feltz | ..................... | C04B 35/493 428/210 |
| 2005/0146249 A1* | 7/2005 | Miyazawa | ......... | H03H 9/02984 310/358 |
| 2009/0230346 A1 | 9/2009 | Hamada et al. | | |
| 2014/0302325 A1* | 10/2014 | Shimada | ................... | C09C 3/12 428/405 |
| 2016/0020381 A1* | 1/2016 | Arakawa | ............... | C04B 35/499 428/220 |

FOREIGN PATENT DOCUMENTS

| | | | |
|---|---|---|---|
| JP | 2003-160313 A | 6/2003 | |
| JP | 2003-212545 A | 7/2003 | |
| JP | 2006-287254 A | 10/2006 | |
| JP | 2006-322785 A | 11/2006 | |
| JP | 2009-221037 A | 10/2009 | |
| JP | 2012-256850 A | 12/2012 | |
| JP | WO 2014/162999 * | 9/2014 | ............. H01L 41/09 |
| JP | 2014-187249 A | 10/2014 | |
| WO | 2014/162999 A1 | 10/2014 | |

OTHER PUBLICATIONS

W. Zhu et. al., "Domain Wall Motion in A and B site Donor-Doped Pb(Zr0.52Ti0.48)O3 Films", J. Am. Ceram. Soc., 95[9], 2012, pp. 2906-2913. (discussed in the spec).

J. Yin et. al., "Enhanced fatigue and retention properties of Pb(Ta0.05Zr0.48Ti0.47)O3 films using La0.25Sr0.75CoO3 top and bottom electrodes", Appl. Phys. Let., vol. 75 No. 23, Dec. 6, 1999, pp. 3698-3700. (discussed in the spec).

H. Shima et. al., "Influence of Pb and La Contents on the Lattice Configuration of La-Substituted Pb(Zr,Ti)O3 Films Fabricated by CSD Method", IEEE Transactions on Ultrasonics, Ferroelectrics, and Frequency Control, vol. 56, No. 4, Apr. 2009, pp. 687-692 (discussed in the spec).

International Search Report dated Apr. 26, 2016, issued for PCT/JP2016/054292 and English translation thereof.

Choi G-P et al., "Phase formations and electrical properties of doped-PZT/PbTiO3 films deposited by reactive sputtering using multi-targets", Materials Science and Engineering: B, Elsevier, Amsterdam, NL, vol. 41, No. 1, Oct. 1, 1996, pp. 16-22. (cited in the Aug. 14, 2018 Search Report issued for EP16752431.3).

(Continued)

*Primary Examiner* — Thomas M Dougherty
(74) *Attorney, Agent, or Firm* — Locke Lord LLP

(57) ABSTRACT

A piezoelectric PTZT film is formed of a metal oxide having a perovskite structure including Pb, Ta, Zr, and Ti, in which the metal oxide further includes carbon, and a content of the carbon is 80 to 800 ppm by mass. In a process for producing a liquid composition for forming a piezoelectric film, a Ta alkoxide, a Zr alkoxide, β-diketones, and a diol are refluxed, a Ti alkoxide is added into a first synthesis solution obtained by the refluxing, and then refluxing is performed again, a Pb compound is added into a second synthesis solution obtained by performing the additional refluxing, and then refluxing is performed again, a solvent is removed from a third synthesis solution obtained by performing the additional refluxing, and then, dilution with alcohol is performed, to produce the liquid composition for forming a piezoelectric PTZT film.

4 Claims, No Drawings

(56) References Cited

OTHER PUBLICATIONS

Search Report dated Aug. 14, 2018, issued for the European patent application No. 16752431.3.
B. Praveen Kumar, et al., "Investigation on PZT-Based Nanostructured Functional Materials," Synthesis and Reactivity in Inorganic, Metal-Organic, and Nano-Metal Chemistry, vol. 44, No. 7, 2014, pp. 991-994 and a cover sheet. (cited in the Aug. 15, 2019 OA issued for CN201680005012.0).
Office Action dated Aug. 15, 2019, issued for the Chinese patent application No. 201680005012.0 and English translation thereof.

\* cited by examiner

PIEZOELECTRIC PTZT FILM, AND PROCESS FOR PRODUCING LIQUID COMPOSITION FOR FORMING SAID PIEZOELECTRIC FILM

TECHNICAL FIELD

The present invention relates to a piezoelectric PTZT film formed by a chemical solution deposition (CSD) method and a process for producing a liquid composition for forming the piezoelectric film. The present invention more specifically relates to a piezoelectric PTZT film having excellent piezoelectric properties, a long average breakdown time, and a high crystal-orientation degree, and a process for producing a liquid composition for forming the piezoelectric film. In the present specification, the piezoelectric PTZT film is a piezoelectric film of a piezoelectric PZT film having a perovskite structure including Pb, Zr, and Ti, in which some Ti and Zr are substituted with Ta. In addition, a PTZT precursor is a precursor of a piezoelectric PTZT film.

Priority is claimed on Japanese Patent Application No. 2015-027132, filed on Feb. 16, 2015, the content of which is incorporated herein by reference.

BACKGROUND ART

In the related art, in the development of a bulk PZT material having a perovskite structure represented by $ABO_3$ including Pb, Zr, and Ti, it is known that piezoelectric properties of the bulk PZT are improved by substituting some Ti and Zr which are B-site ions with donor ions having different valences, such as Nb, Ta, and W. From such a background, a PZT-based ferroelectric film, in which some Ti are substituted with Nb or Ta, has been disclosed (for example, see PTLs 1 and 2). In addition, it is reported that, in a PZT film doped with 2 mol % of Nb, a gain of a piezoelectric constant becomes maximum (for example, see NPL 1). On the other hand, PTZT ferroelectric film in which some of Ti and Zr are substituted with Ta is reported (for example, see, NPL 2).

As described above, a method of improving a piezoelectric constant by substituting some A-site atoms or B-site atoms of a perovskite compound represented by $ABO_3$ with atoms of higher valency has been widely used for bulk materials. On the other hand, it is reported that, in the PZT film formed by the CSD method represented by a sol-gel method, La added is not only substituted for A-site ions which are targets, but is also substituted for B-site ions which are not targets (for example, see NPL 3). Even regarding the adding of Nb atoms reported in NPL 1 described above, since Nb atoms may be trivalent, tetravalent, or pentavalent atoms, the Nb atoms may be substituted for A-site ions as trivalent ions, even when it is intended that the Nb atoms are substituted for B-site ions as pentavalent ions. In practice, in the CSD method, it is optimal to add approximately 2 mol % of Nb atoms, and when more Nb atoms are added, a piezoelectric constant ($e_{31,f}$) is degraded, as shown in FIG. 11 of NPL 1.

In addition, PTL 3 discloses a process for producing a ferroelectric thin film for forming an orientation-controlled layer in which crystalline orientation is controlled to the (100) plane on a lower electrode which will be described later.

CITATION LIST

Patent Literature

[PTL 1] Japanese Unexamined Patent Application, First Publication No. 2005-333105 (Claims 1 and 2)

[PTL 2] Japanese Unexamined Patent Application, First Publication No. 2006-287254 (Claim 2 and Abstract)

[PTL 3] Japanese Unexamined Patent Application, First Publication No. 2012-256850 (Claims 1 to 3)

Non-Patent Literature

[NPL 1] W. Zhu et. al. "Domain Wall Motion in A and B site Donor-Doped Pb($Zr_{0.52}Ti_{0.48}$)$O_3$) Films", J. Am. Ceram. Soc., 95[9] 2906-2913 (2012)

[NPL 2] J. Yin et. al. "Enhanced fatigue and retention properties of Pb($Ta_{0.05}Zr_{0.48}Ti_{0.47}$)$O_3$) films using $La_{0.25}Sr_{0.75}CoO_3$ top and bottom electrodes", Appl. Phys. Let. Vol. 75 No. 23, 6 Dec. 1999

[NPL 3] H. Shima et. al. "Influence of Pb and La Contents on the Lattice Configuration of La-Substituted Pb(Zr,Ti)$O_3$ Films Fabricated by CSD Method", IEEE Transactions on Ultrasonics, Ferroelectrics, and Frequency Control, Vol. 56, No. 4, April 2009

DISCLOSURE OF INVENTION

Technical Problem

Regarding a PTZT ferroelectric film reported in NPL 2, an evaluation result of a film of FeRAM which is a non-volatile memory is obtained, but an evaluation result of a piezoelectric film has not been reported.

An object of the present invention is to provide a piezoelectric PTZT film having excellent piezoelectric properties, a long average breakdown time, and a high crystal-orientation degree, and a process for producing a liquid composition for forming the piezoelectric film.

Solution to Problem

The inventors have found from NPL 3 that, even when some Ti and Zr which are B-site ions of a metal oxide having a perovskite structure represented by $ABO_3$ including Pb, Zr, and Ti are intended to be substituted with Nb, the Nb atoms which may be trivalent, tetravalent, or pentavalent atoms may be substituted for A-site ions as trivalent ions. Accordingly, the inventors focused on Ta which has the same atomic radius as that of Nb and is more stable as a pentavalent atom. That is, the inventors have found that, when some of Zr and Ti are substituted with Ta which is more stable as a pentavalent atom, and Ta alkoxide and Zr alkoxide are allowed to be reacted with a diol, at the time of synthesizing a precursor substance, to allow the carbon content to remain in a film at a given concentration during the process and to allow carbon to be suitably included in the film, it is possible to form a piezoelectric PTZT film having excellent piezoelectric properties, a long average breakdown time, and a high crystal-orientation degree, and thus, the inventors achieved the present invention.

According to a first aspect of the invention, there is provided a piezoelectric PTZT film formed of a metal oxide having a perovskite structure including Pb, Ta, Zr, and Ti, in which the metal oxide further includes carbon, and a content of the carbon is 80 to 800 ppm by mass.

According to a second aspect of the invention, in the piezoelectric PTZT film of the invention according to the first aspect, a fraction of Ta atoms with respect to total metal atoms of Zr atoms and Ti atoms is in a range of $0 < Ta \leq 0.04$.

According to a third aspect of the invention, there is provided a process for producing a liquid composition for forming a piezoelectric PTZT film, the method including: a step of preparing a first synthesis solution by refluxing a Ta alkoxide, a Zr alkoxide, β-diketones, and a diol to allow the Ta alkoxide and the Zr alkoxide to react with the diol; a step of preparing a second synthesis solution by adding a Ti alkoxide to the first synthesis solution to allow the refluxing and the reaction again; a step of preparing a third synthesis solution by adding a Pb compound to the second synthesis solution to further allow the refluxing and the reaction; and a step of preparing a fourth synthesis solution by removing a solvent from the third synthesis solution and diluting the solution with alcohol, in which, when the total amount of the Ta alkoxide, the Zr alkoxide, and the Ti alkoxide is set as 1 mole, the diol and the β-diketones are included with fractions so that the content of diol is 7 to 11 moles and the content of β-diketones is 1.5 to 3.0 moles with respect to the total amount.

According to a fourth aspect of the invention, there is provided a process for forming a piezoelectric PTZT film including: a step of forming a PTZT precursor film by applying the liquid composition for forming a piezoelectric PTZT film produced by the process according to the third aspect on an orientation-controlled film of a substrate and drying the liquid composition; a step of calcinating the PTZT precursor film; and a step of sintering the PTZT precursor film which is calcinated.

According to a fifth aspect of the invention, there is provided an electronic component including the piezoelectric PTZT film according to the first or second aspect.

Advantageous Effects of Invention

The piezoelectric PTZT film according to the first aspect of the invention is produced by adding pentavalent Ta atoms into the metal oxide having a perovskite structure including Pb, Zr, and Ti. When adding the Ta atoms, Ta is hardly substituted for A-site ions and is reliably substituted for some of Zr and Ti which are B-site ions. In addition, the metal oxide includes a predetermined amount of carbon. From these viewpoints, when the Ta atoms added are substituted for B-site, lead deficiency occurs in PZT, the movement of domains easily occurs, and therefore, a piezoelectric PTZT film having excellent piezoelectric properties, a long average breakdown time, and a high crystal-orientation degree is obtained.

In the second aspect of the invention, when the fraction of the Ta atoms with respect to the total metal atoms of the Zr atoms and the Ti atoms is in a range of $0<Ta\leq 0.04$, a precipitate is hardly generated in the solution, when preparing a liquid composition for forming a piezoelectric PTZT film which will be described later.

In the third aspect of the invention, when the piezoelectric PTZT film is formed from this liquid composition by refluxing a Ta alkoxide, a Zr alkoxide, β-diketones, and a diol to allow the Ta alkoxide and the Zr alkoxide to react with the diol in the step of preparing the first synthesis solution, a predetermined amount of carbon can be included in the piezoelectric film, and when a Ta alkoxide and a Zr alkoxide are compounded for stabilization, it is possible to prevent the generation of a precipitate and increase storage stability.

In the fourth aspect of the invention, when the PTZT precursor film is formed by applying the liquid composition for forming a piezoelectric PTZT film produced by the process according to the third aspect on the orientation-controlled film of the substrate and drying the liquid composition, and the PTZT precursor film is calcinated and sintered, it is possible to form the piezoelectric PTZT film having a high orientation degree controlled to crystalline orientation of the orientation-controlled film.

In the fifth aspect of the invention, an electronic component having excellent piezoelectric properties and a long average breakdown time is obtained by using the piezoelectric PTZT film of the first or second aspect.

BEST MODE FOR CARRYING OUT THE INVENTION

Next, embodiments for achieving the invention will be described.

[Piezoelectric PTZT Film]

A piezoelectric PTZT film which is the embodiment of the invention is a piezoelectric PTZT film in which a metal oxide having a perovskite structure including Pb such as lead zirconate titanate (PZT) is doped with Ta, and the content of carbon in the film is 80 to 800 ppm by mass as an average value. When the content of carbon is smaller than 80 ppm by mass, the amount of carbon atoms is insufficient in the vicinity of a sintering interface of the piezoelectric PTZT film, a leakage current cannot be sufficiently prevented, and thus, deterioration of the piezoelectric PTZT film with time is promoted. As a result, an average breakdown time of the piezoelectric PTZT film is shortened. In addition, when the content of carbon is greater than 800 ppm by mass, crystallinity is deteriorated, and thus, piezoelectric properties of the piezoelectric PTZT film are deteriorated. A preferable range of the content of carbon is 100 to 300 ppm by mass. In addition, the fraction of the Ta atoms in the piezoelectric film is preferably in a range of $0<Ta\leq 0.04$, with respect to total metal atoms of Zr atoms and Ti atoms. When preparing a liquid composition which will be described later, so that the fraction of the Ta atoms in the piezoelectric film exceeds 0.04, a precipitate is easily generated in the solution at the time of preparation and storage. A preferable fraction of the Ta atoms in the piezoelectric film is in a range of 0.01 to 0.03. In addition, when Ta atoms are not included at all, it is difficult to improve the piezoelectric properties of the piezoelectric PTZT film.

The piezoelectric PTZT film according to the embodiment of the invention includes Pb, Ta, Zr, and Ti so as to have a predetermined metal atom ratio. Specifically, the metal atom ratio (Pb:Ta:Zr:Ti) in the piezoelectric PTZT film preferably satisfies (0.99 to 1.04):(0.01 to 0.04):(0.40 to 0.60):(0.40 to 0.60). When the fraction of Pb is smaller than the lower limit value, a large amount of pyrochlore phase is included in the piezoelectric PTZT film, and thus, electrical properties such as piezoelectric properties are significantly easily deteriorated. On the other hand, when the fraction of Pb exceeds the upper limit value, a large amount of PbO remains in the piezoelectric PTZT film, and thus, a leakage current increases and electrical reliability of the film is easily deteriorated (the average breakdown time is easily shortened). That is, an excessive amount of lead easily remains in the film and leak properties or insulating properties are easily deteriorated. In addition, when the fractions of Zr and Ti are beyond the range described above, it is difficult to sufficiently improve a piezoelectric constant of the piezoelectric PTZT film. Further, when the fraction of Ta is smaller than 0.01, it is difficult to sufficiently improve piezoelectric properties of the piezoelectric PTZT film. On the other hand, when the fraction of Ta exceeds the upper limit value, it is difficult to synthesize the liquid composition.

[Process for Producing Liquid Composition for Forming Piezoelectric PTZT Film]

(1) Step of Preparing First Synthesis Solution

In a step of preparing a first synthesis solution, a Ta alkoxide, a Zr alkoxide, β-diketones, and a diol are refluxed to allow the Ta alkoxide and the Zr alkoxide to react with the diol, and thus, a first synthesis solution is produced. Specifically, the Ta alkoxide and the Zr alkoxide are weighed so as to have fractions for applying the predetermined metal atom ratio in the piezoelectric PTZT film after forming the film. The weighed Ta alkoxide and Zr alkoxide are put into a reaction vessel and mixed with the β-diketones and the diol, and the components are preferably refluxed at a temperature of 130° C. to 175° C. in a nitrogen atmosphere for 0.5 to 3 hours to prepare the synthesis solution.

As the Ta alkoxide, an alkoxide such as tantalum pentaethoxide is used. The tantalum pentaethoxide is preferable because tantalum pentaethoxide is easily available, but reactivity is high and a precipitate is extremely easily generated. Accordingly, in the step of preparing the first synthesis solution, the Zr alkoxide, the Ta alkoxide, the β-diketones, and the diol are allowed to react with each other by refluxing at the same time, and thus, precipitation of the Ta alkoxide is prevented. As the Zr alkoxide, an alkoxide such as zirconium-n-butoxide or zirconium-tert-butoxide is used. In addition, as the β-diketones (stabilizer), acetylacetone, heptafluorobutanoyl pivaloylmethane, dipivaloylmethane, trifluoroacetylacetone, or benzoylacetone is used. Among these, acetylacetone is preferable, because acetylacetone is easily available. In addition, as the diol, propylene glycol, ethylene glycol, or 1,3-propanediol is used. Among these, propylene glycol or ethylene glycol is preferable, because propylene glycol or ethylene glycol has low toxicity and an effect of increasing the storage stability is obtained. When the diol is set as an essential solvent component, it is possible to set the content of carbon in the piezoelectric PTZT film in a predetermined range and to increase the storage stability of the liquid composition, by adjusting the amount of the diol added.

(2) Step of Preparing Second Synthesis Solution

In a step of preparing a second synthesis solution, a Ti alkoxide is added into the synthesis solution in the reaction vessel, while maintaining the temperature of the first synthesis solution, and the components are preferably refluxed and reacted with each other again in a nitrogen atmosphere for 0.5 to 5 hours to prepare the second synthesis solution. As the Ti alkoxide, an alkoxide such as titanium tetraethoxide: $Ti(OEt)_4$, titanium tetraisopropoxide: $Ti(OiPr)_4$, titanium tetra n-butoxide: $Ti(OnBu)_4$, titanium tetraisobutoxide: $Ti(OiBu)_4$, titanium tetra t-butoxide: $Ti(OtBu)_4$, or titanium dimethoxy diisopropoxide: $Ti(OMe)_2(OiPr)_2$ is used. The Ti alkoxide is added in the step of preparing the second synthesis solution after the step of preparing the first synthesis solution, in order to increase the storage stability and prevent the generation of a precipitate, by allowing the Ta alkoxide and the Zr alkoxide to react with each other and promoting realization of a composite alkoxide.

(3) Step of Preparing Third Synthesis Solution

In a step of preparing a third synthesis solution, the second synthesis solution is cooled to room temperature by performing radiational cooling at room temperature, a Pb compound is added into the synthesis solution in the reaction vessel to further allow the refluxing and reaction, and thus, the third synthesis solution is prepared. As the Pb compound, acetate such as lead acetate: $Pb(OAc)_2$ or an alkoxide such as lead diisopropoxide: $Pb(OiPr)_2$ is used. The Pb compound is added in the step of preparing the third synthesis solution after the step of preparing the second synthesis solution, in order to prevent precipitation by allowing a reaction between the stable liquid composition including Ta, Zr, and Ti and the Pb compound to synthesize a composite alkoxide.

(4) Step of Preparing Fourth Synthesis Solution

In a step of preparing a fourth synthesis solution, after removing a solvent from the third synthesis solution, the fourth synthesis solution is prepared by diluting the solution with alcohol. The solvent is removed from the synthesis solution by a method of atmospheric distillation or vacuum distillation, for example, and the liquid composition for forming a piezoelectric PTZT film according to the embodiment of the invention is prepared. As alcohol, ethanol, n-butanol, n-octanol or the like is used. The concentration of the liquid composition after the dilution is 10 to 35 mass % and preferably 20 to 25 mass % in terms of oxide concentration. The concentration of the liquid composition is set to be in the range described above, because, when the concentration thereof is smaller than the lower limit value, sufficient film thickness is hardly obtained, and on the other hand, when the concentration thereof exceeds the upper limit value, cracks are easily generated. The oxide concentration of the concentration of the PTZT precursor occupying the liquid composition is a concentration of a metal oxide occupying 100 mass % of the liquid composition, which is calculated by assuming that all metal atoms included in the liquid composition have become the desired oxides.

(5) Additive Amount of Diol and β-Diketones

When the total amount of the Ta alkoxide, the Zr alkoxide, and the Ti alkoxide is set as 1 mole, the diol in the liquid composition for forming a piezoelectric PTZT film according to the embodiment of the invention is added so that the content is 7 to 11 moles with respect to the total amount. When the amount of the diol added is smaller than 7 moles, the content of carbon in the piezoelectric PTZT film is smaller than 80 ppm by mass, and when the amount thereof exceeds 11 moles, the content of carbon in the piezoelectric PTZT film exceeds 800 ppm by mass. In addition, the β-diketones (stabilizer) in the liquid composition for forming a piezoelectric PTZT film of the invention is added so that the content is 1.5 to 3.0 moles with respect to the total amount. When the amount of β-diketones added is smaller than 1.5 moles, a precipitate is generated, and even when the amount thereof exceeds 3.0 moles, an effect is not changed. When the total amount of the Ta alkoxide, the Zr alkoxide, and the Ti alkoxide is set as 1 mole, the diol in the liquid composition for forming a piezoelectric PTZT film is preferably added so that the content is 7 to 9 moles with respect to the total amount, but there is no limitation. The β-diketones in the liquid composition for forming a piezoelectric PTZT film is preferably added so that the content is 1.5 to 2.5 moles with respect to the total amount, but there is no limitation.

The PTZT precursor included in the liquid composition for forming a piezoelectric PTZT film according to the embodiment of the invention is a raw material for configuring the metal oxide in the piezoelectric film after formation, and a Pb source, a Ta source, a Zr source, and a Ti source are included so that the metal atom ratio (Pb:Ta:Zr:Ti) in the piezoelectric PTZT film satisfies (0.99 to 1.04):(0.01 to 0.04):(0.40 to 0.60):(0.40 to 0.60). Specifically, the Pb compound, the Ta alkoxide, the Zr alkoxide, and the Ti alkoxide are weighed so that the metal atom ratio (Pb:Ta:Zr:Ti) in the PTZT precursor becomes (1.00 to 1.25):(0.01 to 0.04):(0.40 to 0.60):(0.40 to 0.60).

[Method for Forming Piezoelectric PTZT Film]

A method for forming the piezoelectric PTZT film by using the liquid composition for forming a piezoelectric PTZT film produced by the process described above will be described. The forming method is a method for forming a piezoelectric film by a sol-gel method, and the liquid composition for forming a piezoelectric PTZT film doped with Ta described above and containing carbon, is used as a raw material solution.

First, the liquid composition for forming a piezoelectric PTZT film is applied onto a substrate, and a coated film (gel film) having a predetermined thickness is formed. The coating method is not particularly limited, and spin coating, dip coating, a liquid source misted chemical deposition (LSMCD) method, or an electrostatic spray method is used. As the substrate where a piezoelectric film is formed, a silicon substrate where a lower electrode is formed or a heat-resistant substrate such as a sapphire substrate is used. A lower electrode formed on a substrate is formed by using a material having conductivity and not reacting with a piezoelectric film, such as Pt, $TiO_x$, Ir, or Ru. For example, the lower electrode can have a double-layered structure of a $TiO_x$ film and a Pt film, in this order, from the substrate side. As a specific example of the $TiO_x$ film, a $TiO_2$ film is used. In a case of using a silicon substrate as a substrate, a $SiO_2$ film can be formed on a surface of this substrate.

It is desired to form an orientation-controlled film in which crystalline orientation is preferentially controlled to the (100) plane, on the lower electrode where a piezoelectric film is formed, before forming the piezoelectric film. This is because a film having aligned polarization directions immediately after being formed can be formed by strongly orienting the piezoelectric PTZT film to the (100) plane. Examples of the orientation-controlled film include an LNO film ($LaNiO_3$ film), a PZT film, or a $SrTiO_3$ film in which crystalline orientation is preferentially controlled to the (100) plane.

As a method of preferentially controlling crystalline orientation of the orientation-controlled layer to the (100) plane, the method disclosed in PTL 3 (hereinafter, referred to as the first method) is used, for example. In this first method, an orientation-controlled layer is formed by applying a composition for forming a ferroelectric thin film onto the lower electrode of a substrate including the lower electrode having crystal plane oriented in the (111) axial direction and performing calcination and sintering of the composition. At this time, a crystal grain size controlling layer is formed on the lower electrode, and the applied amount of the composition for forming a ferroelectric thin film on the crystal grain size controlling layer is set so that a layer thickness of the orientation-controlled layer after crystallization is in a range of 35 nm to 150 nm and a temperature at the time of calcination is set to be in a range of 150° C. to 200° C. or 285° C. to 315° C.

After forming the PTZT precursor film which is a coating film on the substrate, this PTZT precursor film is calcinated, sintered, and crystallized. The calcination is performed under predetermined conditions by using a hot plate, a rapid heating process (RTA) or the like. The calcination is performed in order to remove a solvent and convert the metal compound into a composite oxide by pyrolysis or hydrolysis, and therefore, the calcination is desirably performed in the air, in the oxidation atmosphere, or in the atmosphere containing water vapor. Even when the heating is performed in the air, moisture necessary for hydrolysis is sufficiently ensured with moisture in the air. Since a low-boiling-point solvent or adsorbed water molecules are particularly removed before the calcination, low temperature heating (drying) may be performed by using a hot plate or the like at a temperature of 70° C. to 90° C. for 0.5 minutes to 5 minutes.

The calcination is performed by holding the temperature preferably at 250° C. to 300° C. for 2 to 5 minutes. In addition, it is preferable to perform the calcination by performing two-stage calcination by changing a heating holding temperature, in order to sufficiently remove a solvent or the like to further increase an effect of preventing voids or cracks or in order to promote densifying of a film structure. In a case of performing the two-stage calcination, a first stage is calcination in which the temperature is held at 250° C. to 300° C. for 3 to 10 minutes, and a second stage is calcination in which the temperature is held at 400° C. to 500° C. for 3 to 10 minutes.

Here, the calcination temperature in the first stage is preferably in a range of 250° C. to 300° C., because pyrolysis of a precursor substance is insufficient and cracks are easily generated, when the calcination temperature is lower than the lower limit value. On the other hand, when the calcination temperature exceeds the upper limit value, the precursor substance on the upper portion of the substrate is decomposed before the precursor substance in the vicinity of the substrate is completely decomposed, the organic matters remain around the substrate of the film, and the voids are easily generated. The calcination time in the first stage is preferably from 3 to 10 minutes, because the decomposition of the precursor substance does not sufficiently proceed, when the calcination time is shorter than the lower limit value, and the process time is increased and productivity may be decreased, when the calcination time exceeds the upper limit value. The calcination temperature in the second stage is preferably in a range of 400° C. to 500° C., because residual organic matters remaining in the precursor substance are not completely removed and the film may not be sufficiently densified, when the calcination temperature is lower than the lower limit value. On the other hand, when the calcination temperature exceeds the upper limit value, it may be difficult to control orientation properties due to promotion of the crystallization. The calcination time in the second stage is preferably from 3 to 10 minutes, because the residual organic matters are not sufficiently removed, and peeling or cracks of the film may be easily generated due to generation of strong stress at the time of crystallization, when the calcination time is shorter than the lower limit value. On the other hand, when the calcination time exceeds the upper limit value, the process time is increased and productivity may be decreased.

In the steps from the application of the liquid composition to the calcination, sintering can finally be collectively performed after repeating the steps up to the calcination several times, so as to have a predetermined film thickness. On the other hand, when the liquid composition according to the embodiment of the invention is used as the raw material solution, stress derived from film contraction generated at the time of forming a film can be prevented. Thus, a thick film having a thickness of approximately several hundreds of nm can be formed by a single coating step, without generating voids or cracks. Accordingly, the number of steps to be repeated described above can be decreased.

The sintering is a step of sintering the PTZT precursor film after the calcination at a temperature equal to or higher than a crystallization temperature to perform crystallization, and a piezoelectric film is obtained by performing this step. As a sintering atmosphere of this crystallization step, $O_2$, $N_2$, Ar, $N_2O$, or $H_2$, or mixed gas thereof is suitable. The sintering is performed at 600° C. to 700° C. for approximately 1 to 5 minutes. The sintering may be performed by RTA. In a case of performing the sintering by the RTA, a rate of temperature rise thereof is preferably 2.5 to 100° C./sec. In addition, a piezoelectric film having a greater thickness may be formed by repeating the steps from applying to sintering of the composition described above several times.

By performing the steps described above, the piezoelectric PTZT film is obtained. It is possible to improve a piezoelectric constant of this piezoelectric film by performing doping with Ta or including a predetermined amount of carbon. Thus, in the piezoelectric film, it is possible to obtain greater displacement and to decrease a dielectric constant. Accordingly, in a case of using this piezoelectric film as a sensor, the advantages are increased. One main reason thereof is considered that Ta added is substituted for Zr or Ti and cause oxygen deficiency. By using this piezoelectric PTZT film, an electronic component such as piezoelectric micro electro mechanical systems (MEMS), an inkjet head, a mirror device, an autofocus, or a pyroelectric sensor is obtained.

EXAMPLES

Next, Examples and Comparative Examples of the invention will be described in detail.

Example 1

First, zirconium butoxide (Zr source), tantalum pentaethoxide (Ta source), acetylacetone (β-diketones), and propylene glycol (diol) were put into a reaction vessel and mixed together. This mixture was refluxed in a nitrogen atmosphere at a temperature of 150° C. for 0.5 hours, to prepare a synthesis solution. Titanium isopropoxide (Ti source) and acetylacetone were added to the obtained synthesis solution, and the synthesis solution was refluxed again at a temperature of 150° C. for 0.5 hours, and cooled to room temperature. Lead acetate trihydrate (Pb source) was added to the obtained synthesis solution and the synthesis solution was refluxed again at a temperature of 150° C. for 1 hour. The unnecessary solvent was removed by performing vacuum distillation, so that a concentration of the PTZT precursor occupying 100 mass % of the synthesis solution obtained by adding lead acetate trihydrate is 35 mass % in terms of an oxide concentration. After removing the solvent, dilution was performed with ethanol and the synthesis solution was diluted until the concentration thereof became 15 mass % in terms of an oxide concentration. Zirconium butoxide, tantalum pentaethoxide, titanium isopropoxide, and lead acetate trihydrate were respectively weighed and mixed with each other so that the composition of the synthesis solution after the dilution (liquid composition for forming a piezoelectric PTZT film) was PTZT (112/1/52/48). In addition, when the total amount of zirconium butoxide, tantalum pentaethoxide, and titanium isopropoxide was set as 1 mole, acetylacetone (β-diketones) and propylene glycol (diol) were included in the liquid composition with fractions so that the content of acetylacetone (Pβ-diketones) was 2 moles with respect to the total amount and the content of propylene glycol (diol) was 7 moles with respect to the total amount.

1,000 μL of the liquid composition for forming a piezoelectric PTZT film was added dropwise onto the uppermost layer (orientation-controlled layer) of a 4-inched silicon substrate including an orientation-controlled layer configured with $Pb_{1.00}Zr_{0.52}Ti_{0.48}O_3$ and having crystalline orientation preferentially controlled to (100) plane by the first method described above, and spin coating was performed at a rotation rate of 3,000 rpm for 15 seconds. A $SiO_2$ film (500 nm), a $TiO_2$ film (20 nm), a Pt film (100 nm), and a PZT film (60 nm), in which crystalline orientation was preferentially controlled to the (100) plane, were laminated on the silicon substrate in this order from the bottom to the top. The numerical values in the brackets are film thicknesses. After the spin coating, the PTZT precursor film (gel film) which is a coating film was calcinated using a hot plate at 300° C. for 3 minutes in the atmosphere. The operation from application to calcination of the liquid composition was repeated 4 times. After that, the temperature increased to 700° C. by using the RTA at a rate of temperature rise of 50° C./sec in the oxygen atmosphere, and the coating film was held at this temperature for 1 minute in the oxygen atmosphere, and accordingly, the precursor PTZT film was sintered. In addition, the operation from the applying to the sintering of the liquid composition was repeated 5 times, and a piezoelectric PTZT film was obtained.

Examples 2 to 8

Liquid compositions for forming a piezoelectric PTZT film of Examples 2 to 8 were prepared in the same manner as in Example 1 and piezoelectric PTZT films of Examples 2 to 8 were obtained in the same manner as in Example 1, except that the fractions of the raw materials were changed as shown in Table 1.

Comparative Example 1

When the total amount of zirconium butoxide, tantalum pentaethoxide, and titanium isopropoxide was set as 1 mole, propylene glycol (diol) was included in the liquid composition so that the content of propylene glycol (diol) was 6 moles with respect to the total amount. Except for this, a liquid composition for forming a piezoelectric PTZT film was prepared in the same manner as in Example 4. 1,000 μL of the liquid composition for forming a piezoelectric PTZT film was added dropwise onto the PZT film (orientation-controlled film) of the uppermost layer of the 4-inched silicon substrate, which is the same as that in Example 1 and was set on a spin coater, and the spin coating was performed in the same manner as in Example 1. After the spin coating, the PTZT precursor film (gel film) which is a coating film was calcinated using a hot plate at 75° C. for 2 minutes in the atmosphere. Then, the PTZT precursor film was irradiated with ultraviolet light at 365 nm for 5 minutes. The temperature increased to 700° C. by using the RTA at a rate of temperature rise of 50° C./sec in the oxygen atmosphere, and the coating film was held at this temperature for 1 minute in the oxygen atmosphere, and accordingly, the precursor PTZT film was sintered. In addition, the operation from applying to sintering of the liquid composition was repeated 19 times, and a piezoelectric PTZT film was obtained. In Comparative Example 1, by performing the irradiation with ultraviolet light after the calcination, organic matters in the film were decomposed, the amount of residual carbon decreased, and a piezoelectric film having a small carbon content was obtained.

Comparative Examples 2 and 3

Liquid compositions for forming a piezoelectric PTZT film of Comparative Examples 2 and 3 were prepared in the same manner as in Example 1 and piezoelectric PTZT films of Comparative Examples 2 and 3 were obtained in the same manner as in Example 1, except that the fractions of the raw materials were changed as shown in Table 1.

Table 1 shows the metal atom ratio in the liquid compositions for forming a piezoelectric film prepared in Examples 1 to 8 and Comparative Examples 1 to 3, the molar quantity of diol, and the molar quantity of β-diketones.

TABLE 1

|  | Metal atom ratio in the liquid composition (Pb:Ta:Zr:Ti) | Diol [mole] | β-Diketones [mole] |
|---|---|---|---|
| Example 1 | 1.12:0.01:0.52:0.48 | 7 | 1.5 |
| Example 2 | 1.13:0.02:0.52:0.48 | 7 | 2.0 |
| Example 3 | 1.12:0.01:0.40:0.60 | 7 | 2.0 |
| Example 4 | 1.14:0.03:0.52:0.48 | 7 | 2.0 |
| Example 5 | 1.14:0.025:0.52:0.48 | 8 | 2.0 |
| Example 6 | 1.15:0.04:0.52:0.48 | 11 | 2.0 |
| Example 7 | 1.15:0.04:0.60:0.40 | 7 | 2.0 |
| Example 8 | 1.12:0.01:0.52:0.48 | 7 | 3.0 |
| Comparative Example 1 | 1.14:0.03:0.52:0.48 | 6 | 2.0 |
| Comparative Example 2 | 1.13:0.02:0.52:0.48 | 7 | 2.0 |
| Comparative Example 3 | 1.15:0.04:0.52:0.48 | 13 | 2.0 |

<Comparative Test and Evaluation>

Regarding the piezoelectric films obtained in Examples 1 to 8 and Comparative Examples 1 to 3, the film thickness, the film composition, the content of carbon in the film, the fraction of the Ta atoms with respect to the total amount of the metal atoms of Zr atoms and Ti atoms in the film, the piezoelectric constant, the average breakdown time, and the orientation degree to (100) plane were respectively evaluated by the following methods. The results thereof are shown in Table 2.

(1) Film thickness: The film thickness (total thickness) of the piezoelectric film was evaluated by SEM (Hitachi, Ltd.: S4300).

(2) Film composition: The composition of the piezoelectric film was analyzed by X-ray fluorescence analysis using an X-ray fluorescence analysis device (manufactured by Rigaku Corporation, product name: Primus III+). In addition, in some Examples and Comparative Examples, the amount of Pb in the liquid composition decreased in the film after the film formation, but this is because the Pb source was evaporated by sintering and the like.

(3) Content of carbon (ppm by mass): The carbon amount of the piezoelectric film in a depth direction was quantified as sensitivity in $SiO_2$ by using secondary ion mass spectrometry (IMS6f manufactured by CAMECA). The values obtained by performing the quantification three times were averaged and the averaged value was set as the content of carbon.

(4) Fraction of the Ta atoms with respect to the total amount of the metal atoms of Zr atoms and Ti atoms in the film: The amount of Ta atom was divided by the total amount of the metal atoms of Zr atoms and Ti atoms, obtained from the film composition of (2) described above, and the fraction thereof was calculated.

(5) Piezoelectric constant $d_{33}$ (pm/V): The piezoelectric constant was measured by Double Beam Laser Interferometer manufactured by aixACCT. In this measurement, a silicon substrate having a thickness of 0.525 mm and a Pt electrode in which an upper electrode has a circular shape having a diameter of 3 mm were used. Specifically, the displacement at the time of applying a voltage of 25 V at 1 kHz was measured by using this device, and a displacement $d_{33}$ in a Z axis direction was calculated from the value.

(6) Average breakdown time (sec): In order to investigate the electrical reliability of the piezoelectric film, a high-acceleration breakdown test was performed by applying a constant voltage at a high temperature and a high voltage. An electrode formed of Pt having a thickness of 0.2 m with 200 μmϕ was formed on the surface of the obtained piezoelectric film by a sputtering method. After that, damage recovery annealing of the electrode formed was performed by using the RTA at a temperature of 700° C. for 1 minute in the oxygen atmosphere, and a thin film capacitor was obtained. The thin film capacitor obtained was set as a test sample. Regarding the test sample, a temperature of the measurement was set as 160° C., field intensity of 0.52 MV/cm was applied, and a change in the leakage current with time was measured until all samples were subjected to dielectric breakdown. For each of the Examples and Comparative Examples, 22 test samples were respectively produced, the time when 63.2% of the samples were subjected to dielectric breakdown by Weibull statistical process was set as the average breakdown time (mean time to failure: MTF). The dielectric breakdown time was defined as a time when the leakage current reached 100 μA.

(7) Orientation degree to (100) plane: The (100) plane orientation degree was obtained by the following expression from the diffraction result obtained by a concentration method using an X-ray diffraction (XRD) device (manufactured by PANalyticalC B.V., product name: Empyrean).

(100) plane orientation degree (%)=[intensity of (100) plane/{intensity of (100) plane+intensity of (110) plane+intensity of (111) plane}]×100

TABLE 2

|  | Film thickness [nm] | Metal atom ratio in the film (Pb:Ta:Zr:Ti) | Carbon content in film [ppm by mass] | Ta/ Zr + Ti [atom ratio] | Piezoelectric constant $d_{33}$ [pm/V] | Average breakdown time [sec] | (100) plane orientation degree (%) |
|---|---|---|---|---|---|---|---|
| Example 1 | 1800 | 0.99:0.01:0.52:0.48 | 100 | 0.01 | 175 | $1.52 \times 10^4$ | 95 |
| Example 2 | 1800 | 1.00:0.02:0.52:0.48 | 130 | 0.02 | 180 | $1.98 \times 10^4$ | 94 |
| Example 3 | 1800 | 1.03:0.01:0.40:0.60 | 120 | 0.01 | 195 | $1.63 \times 10^4$ | 99 |
| Example 4 | 1800 | 1.03:0.03:0.52:0.48 | 80 | 0.03 | 160 | $1.36 \times 10^4$ | 98 |
| Example 5 | 1800 | 1.03:0.025:0.52:0.48 | 240 | 0.025 | 190 | $7.22 \times 10^4$ | 93 |
| Example 6 | 1800 | 1.04:0.04:0.52:0.48 | 800 | 0.04 | 132 | $2.03 \times 10^4$ | 99 |
| Example 7 | 1800 | 1.03:0.04:0.60:0.40 | 140 | 0.04 | 140 | $2.10 \times 10^4$ | 92 |
| Example 8 | 1800 | 0.99:0.01:0.52:0.48 | 100 | 0.01 | 170 | $1.48 \times 10^4$ | 96 |
| Comparative Example 1 | 1800 | 1.03:0.03:0.52:0.48 | 30 | 0.03 | 110 | $6.44 \times 10^3$ | 94 |

TABLE 2-continued

|  | Film thickness [nm] | Metal atom ratio in the film (Pb:Ta:Zr:Ti) | Carbon content in film [ppm by mass] | Ta/ Zr + Ti [atom ratio] | Piezoelectric constant $d_{33}$ [pm/V] | Average breakdown time [sec] | (100) plane orientation degree (%) |
|---|---|---|---|---|---|---|---|
| Comparative Example 2 | 1800 | 1.00:0:0.52:0.48 | 50 | 0 | 87 | $1.08 \times 10^4$ | 93 |
| Comparative Example 3 | 1800 | 1.04:0.04:0.52:0.48 | 820 | 0.04 | 103 | $1.83 \times 10^4$ | 91 |

As shown in Table 2, the piezoelectric film of Comparative Example 1 includes Ta, but the content of carbon was as low as 30 ppm by mass. Thus, the piezoelectric constant $d_{33}$ was as low as 110 pm/V and the average breakdown time was significantly as short as $6.44 \times 10^3$ seconds. In addition, the piezoelectric film of Comparative Example 2 does not include Ta and has low carbon content of 50 ppm by mass. Thus, the piezoelectric constant $d_{33}$ was significantly as low as 87 pm/V and the average breakdown time was as short as $1.08 \times 10^4$ seconds. Further, the piezoelectric film of Comparative Example 3 includes Ta, but the content of carbon was as high as 820 ppm by mass. Thus, the piezoelectric constant $d_{33}$ was as low as 103 pm/V, even though the average breakdown time was as long as $1.83 \times 10^4$ seconds. On the other hand, in the piezoelectric films of Examples 1 to 8, the content of carbon was in a range of 80 to 800 ppm by mass and Ta was included. Thus, the piezoelectric constant was high, the average breakdown time was long, and the (100) plane orientation degree was as high as 92% to 99%, compared to those in Comparative Examples 1 to 3.

INDUSTRIAL APPLICABILITY

The piezoelectric PTZT film of the invention can be used in electronic components such as piezoelectric micro electro mechanical systems (MEMS), an inkjet head, a mirror device, an autofocus, or a pyroelectric sensor.

The invention claimed is:
1. A piezoelectric PTZT film, formed of a metal oxide having a perovskite structure including Pb, Ta, Zr, and Ti,
wherein the metal oxide further includes carbon, and a content of the carbon is 80 to 800 ppm by mass,
a fraction of Ta atoms with respect to total metal atoms of Zr atoms and Ti atoms is in a range of 0<Ta≤0.04.

2. A process for producing a liquid composition for forming a piezoelectric PTZT film, the method comprising:
a step of preparing a first synthesis solution by refluxing a Ta alkoxide, a Zr alkoxide, β-diketones, and a diol to allow the Ta alkoxide and the Zr alkoxide to react with the diol;
a step of preparing a second synthesis solution by adding a Ti alkoxide to the first synthesis solution to allow the refluxing and the reaction again;
a step of preparing a third synthesis solution by adding a Pb compound to the second synthesis solution to further allow the refluxing and the reaction; and
a step of producing a liquid composition for forming a piezoelectric PTZT film which is a fourth synthesis solution by removing a solvent from the third synthesis solution and diluting the solution with alcohol,
wherein, when the total amount of the Ta alkoxide, the Zr alkoxide, and the Ti alkoxide is set as 1 mole, the liquid composition for forming a piezoelectric PTZT film includes the diol and the β-diketones with fractions so that the content of diol is 7 to 11 moles and the content of β-diketones is 1.5 to 3.0 moles.

3. The process for forming a piezoelectric PTZT film comprising:
a step of forming a PTZT precursor film by applying the liquid composition for forming a piezoelectric PTZT film produced by the process according to claim 2 on an orientation-controlled film of a substrate and drying the liquid composition;
a step of calcinating the PTZT precursor film; and
a step of sintering the PTZT precursor film which is calcinated.

4. An electronic component comprising the piezoelectric PTZT film according to claim 1.

* * * * *